(12) United States Patent
Walitzki

(10) Patent No.: US 7,589,348 B2
(45) Date of Patent: Sep. 15, 2009

(54) THERMAL TUNNELING GAP DIODE WITH INTEGRATED SPACERS AND VACUUM SEAL

(75) Inventor: Hans Juergen Walitzki, Portland, OR (US)

(73) Assignee: Borealis Technical Limited, Gibraltar ( * ) Notice: Subject to any disclaimer, the term of this patent is extended or adjusted under 35 U.S.C. 154(b) by 0 days.

(21) Appl. No.: 11/376,520

(22) Filed: Mar. 14, 2006

(65) Prior Publication Data

US 2007/0013055 A1    Jan. 18, 2007

Related U.S. Application Data

(60) Provisional application No. 60/662,058, filed on Mar. 14, 2005.

(51) Int. Cl.
*H01L 29/40* (2006.01)
(52) U.S. Cl. .................. 257/46; 257/104; 257/E29.339
(58) Field of Classification Search .................. 257/717, 257/318, 46, 104, 106, E39.013, E29.042, 257/E29.34, E29.339, E21.367, E21.353; 310/306
See application file for complete search history.

(56) References Cited

U.S. PATENT DOCUMENTS

| | | | |
|---|---|---|---|
| 2,510,397 A | 6/1950 | Hansell | |
| 2,915,652 A | 12/1959 | Hatsopoulos | |
| 3,021,472 A | 2/1962 | Hernqvist | |
| 3,118,107 A | 1/1964 | Gabor | |
| 3,169,200 A | 2/1965 | Huffman | |
| 3,173,032 A * | 3/1965 | Maynard | 310/306 |
| 3,194,989 A | 7/1965 | Garbuny | |
| 3,238,395 A | 3/1966 | Sense | |
| 3,239,745 A | 3/1966 | Hernqvist | |
| 3,267,307 A | 8/1966 | Fox | |
| 3,267,308 A | 8/1966 | Hernqvist | |
| 3,281,372 A | 10/1966 | Haas | |
| 3,300,660 A | 1/1967 | Bensimon | |
| 3,328,611 A | 6/1967 | Davis | |
| 3,376,437 A | 4/1968 | Meyerand, Jr. | |
| 3,393,330 A | 7/1968 | Vary | |
| 3,470,393 A | 9/1969 | Moncorge | |
| 3,515,908 A | 6/1970 | Caldwell | |
| 3,519,854 A | 7/1970 | Davis | |
| 3,578,992 A | 5/1971 | Shimada | |

(Continued)

FOREIGN PATENT DOCUMENTS

DE          4025618 A1     2/1992

(Continued)

OTHER PUBLICATIONS

Fitzpatrick, G.O. et al. "Close-Spaced Thermionic Converters with Active Spacing Control and Heat-Pipe Isothermal Emitters." 1996, IEEE.vol. 2: 920-927 (1996).

(Continued)

*Primary Examiner*—Thao P. Le

(57) ABSTRACT

A thermionic or thermotunneling gap diode device consisting of two silicon electrodes maintained at a desired distance from one another by means of spacers. These spacers are formed by oxidizing one electrode, protecting certain oxidized areas and removing the remainder of the oxidized layer. The protected oxidized areas remain as spacers. These spacers have the effect of maintaining the electrodes at a desired distance without the need for active elements, thus greatly reducing costs.

18 Claims, 10 Drawing Sheets

U.S. PATENT DOCUMENTS

| | | | |
|---|---|---|---|
| 3,600,933 A | | 8/1971 | Johnston |
| 3,740,592 A | | 6/1973 | Engdahl et al. |
| 3,821,462 A | | 6/1974 | Kaufman et al. |
| 3,843,896 A | | 10/1974 | Rason et al. |
| 4,004,210 A | | 1/1977 | Yater |
| 4,011,582 A | | 3/1977 | Cline et al. |
| 4,039,352 A | | 8/1977 | Marinescu |
| 4,063,965 A | | 12/1977 | Cline et al. |
| 4,188,571 A | | 2/1980 | Brunson |
| 4,224,461 A | | 9/1980 | Snyder, Jr. et al. |
| 4,281,280 A | | 7/1981 | Richards |
| 4,373,142 A | * | 2/1983 | Morris ............... 310/306 |
| 4,410,951 A | | 10/1983 | Nakamura |
| 4,423,347 A | | 12/1983 | Kleinschmidt |
| 4,667,126 A | | 5/1987 | Fitzpatrick |
| 4,880,975 A | | 11/1989 | Nishioka et al. |
| 4,928,030 A | | 5/1990 | Culp |
| 4,937,489 A | | 6/1990 | Hattori |
| 4,958,201 A | | 9/1990 | Mimura |
| 5,028,835 A | | 7/1991 | Fitzpatrick |
| 5,049,775 A | | 9/1991 | Smits |
| 5,068,535 A | | 11/1991 | Rabalais |
| 5,083,056 A | | 1/1992 | Kondou |
| 5,119,151 A | | 6/1992 | Onda |
| 5,229,320 A | | 7/1993 | Ugajin |
| 5,233,205 A | | 8/1993 | Usagawa |
| 5,247,223 A | | 9/1993 | Mori |
| 5,307,311 A | | 4/1994 | Sliwa, Jr. |
| 5,309,056 A | | 5/1994 | Culp |
| 5,327,038 A | | 7/1994 | Culp |
| 5,332,952 A | | 7/1994 | Ugajin |
| 5,336,547 A | | 8/1994 | Kawakita et al. |
| 5,351,412 A | | 10/1994 | Furuhata |
| 5,356,484 A | | 10/1994 | Yater |
| 5,371,388 A | | 12/1994 | Oda |
| 5,399,930 A | | 3/1995 | Culp |
| 5,410,166 A | | 4/1995 | Kennel |
| 5,465,021 A | | 11/1995 | Visscher |
| 5,487,790 A | | 1/1996 | Yasuda |
| 5,503,963 A | | 4/1996 | Bifano |
| 5,521,735 A | | 5/1996 | Shimizu |
| 5,592,042 A | | 1/1997 | Takuchi |
| 5,675,972 A | | 10/1997 | Edelson |
| 5,699,668 A | | 12/1997 | Cox |
| 5,701,043 A | | 12/1997 | Razzaghi |
| 5,722,242 A | | 3/1998 | Edelson |
| 5,810,980 A | | 9/1998 | Edelson |
| 5,874,039 A | | 2/1999 | Edelson |
| 5,917,156 A | | 6/1999 | Nobori et al. |
| 5,973,259 A | | 10/1999 | Edelson |
| 5,981,071 A | | 11/1999 | Cox |
| 5,981,866 A | | 11/1999 | Edelson |
| 5,994,638 A | | 11/1999 | Edelson |
| 6,064,137 A | * | 5/2000 | Cox ............... 310/306 |
| 6,084,173 A | | 7/2000 | DiMatteo |
| 6,089,311 A | | 7/2000 | Edelson |
| 6,117,344 A | | 9/2000 | Cox et al. |
| 6,214,651 B1 | | 4/2001 | Cox |
| 6,225,205 B1 | | 5/2001 | Kinoshita |
| 6,232,546 B1 | | 5/2001 | DiMatteo et al. |
| 6,281,514 B1 | | 8/2001 | Tavkhelidze |
| 6,417,060 B2 | | 7/2002 | Tavkhelidze et al. |
| 6,489,704 B1 | * | 12/2002 | Kucherov et al. ............ 310/306 |
| 6,720,704 B1 | * | 4/2004 | Tavkhelidze et al. ........ 310/306 |
| 6,774,003 B2 | | 8/2004 | Tavkhelidze et al. |
| 6,869,855 B1 | | 3/2005 | Tavkhelidze et al. |
| 6,876,123 B2 | * | 4/2005 | Martinovsky et al. ....... 310/306 |
| 6,946,596 B2 | * | 9/2005 | Kucherov et al. ............ 136/205 |
| 6,969,907 B2 | * | 11/2005 | Imai et al. .................... 257/713 |
| 6,975,060 B2 | | 12/2005 | Styblo et al. |
| 7,169,006 B2 | | 1/2007 | Tavkhelidze et al. |
| 7,211,891 B2 | * | 5/2007 | Shimogishi et al. ......... 257/717 |
| 7,253,549 B2 | | 8/2007 | Tavkhelidze et al. |
| 2001/0046749 A1 | | 11/2001 | Tavkhelidze et al. |
| 2002/0170172 A1 | | 11/2002 | Tavkhelidze et al. |
| 2003/0042819 A1 | * | 3/2003 | Martinovsky et al. ....... 310/306 |
| 2003/0068431 A1 | | 4/2003 | Taliashvili et al. |
| 2003/0152815 A1 | | 8/2003 | LaFollette et al. |
| 2004/0029341 A1 | | 2/2004 | Cox et al. |
| 2004/0195934 A1 | | 10/2004 | Tanielian |
| 2005/0104512 A1 | | 5/2005 | Tavkhelidze et al. |
| 2005/0110099 A1 | * | 5/2005 | Shimogishi et al. ......... 257/378 |
| 2007/0056623 A1 | | 3/2007 | Tavkhelidze et al. |

FOREIGN PATENT DOCUMENTS

| | | |
|---|---|---|
| JP | 404080964 A | 3/1992 |
| JP | 07322659 A | 12/1995 |
| SU | 861916 A | 9/1981 |
| WO | WO-97/02460 A1 | 1/1997 |
| WO | WO-99/10974 A1 | 3/1999 |
| WO | WO-99/13562 A1 | 3/1999 |
| WO | WO-03/021758 A2 | 3/2003 |
| WO | WO-03/083177 A3 | 10/2003 |
| WO | WO-03/090245 A1 | 10/2003 |

OTHER PUBLICATIONS

Fitzpatrick, G.O. et al. "Demonstration of Close-Spaced Thermionic Converters." Abs. Papers. Am. Chem. Soc. 93355: 1.573-1.580 (1993).

Fukuda. R. et al. "Development of the Oxygenated Thermionic Energy Converters Utilizing the Sputtered Metal Oxides as a Collector." Am. Inst. Phys.: 1444-1451 (1999).

Hatsopoulos, G.N. et al. "Thermionic Energy Conversion, vol. 1 Process and Devices." MIT: 222 (1974).

Houston. J.M. "Theoretical Efficiency of the Thermionic Energy Converter." J.Appl. Phys. 30: 481-487 (1959).

Huffman, F.N. et al. "Preliminary Investigation of a Thermotunnel Converter." I.E.C.E.C. vol. 1: 573-579 (1988).

King. D.B. et al. "Results from the Microminiature Thermionic Converter Demonstration Testing Program." Am. Inst. of Phys. 1-56396-846: 1432-1436 (1999).

Mahan, G.D. "Thermionic Refrigeration." J. Appl. Phys. 76: 4362-4366 (1994).

Shakouri. A. et al. "Enhanced Thermionic Emission Cooling in High Barrier Superlattice Hetero-structures." Mat. Res. Soc. 545: 449-458 (1999).

Svensson, R. et al. "TEC as Electric Generator in an Automobile Catalytic Converter." IEEE. vol. 2: 941-944 (1996).

Zeng. T et al. "Hot Electron Effects on Thermionic Emission Cooling in Heterostructures." Mat. Res. Soc. 545: 467-472 (1999).

Fitzpatrick, G. O. et al. : "Updated perspective on the potential for thermionic conversion to meet 21st century energy needs" IECEC '97, Proceedings of the 32nd Intersociety Energy Conversion Engineering Conference. Energy Systems, Renewable Energy Resources, Environmental Impact and Policy Impacts on Energy. Honolulu, HI Jul. 27-Aug. 1, 1997, Intersociety Energy Convers. vol. 3.&4, Jul. 27, 1997. pp. 1045-1051.

Kalandarishvili, A.G.: "The basics of the technology of creating a small interelectrode spacing in thermionic energy converters with the use of two-phase systems" IECEC '97, Proceedings of the 32nd Intersociety Energy Conversion Engineering Conference. Energy Systems, Renewable Energy Resources, Environmental Impact and Policy Impacts on Energy. Honolulu, HI Jul. 27-Aug. 1, 1997, Intersociety Energy Convers. vol. 3.&4, Jul. 27, 1997. pp. 1052-1056.

* cited by examiner

THERMAL TUNNELING GAP DIODE WITH INTEGRATED SPACERS AND VACUUM SEAL

CROSS-REFERENCE TO RELATED APPLICATIONS

This application claims the benefit of U.S. Provisional App. No. 60/662,058, filed Mar. 14, 2005.

BACKGROUND OF THE INVENTION

This present invention is directed towards devices for cooling. In particular it is directed toward devices for cooling Integrated Circuits, such as high-performance Micro-Processors, VLSI chipsets, Infra-Red imaging sensors, and the like.

In U.S. Pat. No. 6,720,704 diode devices are disclosed in which the separation of the electrodes is set and controlled using piezo-electric, electrostrictive or magnetostrictive actuators. This avoids problems associated with electrode spacing changing or distorting as a result of heat stress. In addition it allows the operation of these devices at electrode separations which permit quantum electron tunneling between them. Pairs of electrodes whose surfaces replicate each other are also disclosed. These may be used in constructing devices with very close electrode spacings.

In U.S. Pat. No. 6,417,060 a method for manufacturing a pair of electrodes comprises fabricating a first electrode with a substantially flat surface and placing a sacrificial layer over a surface of the first electrode, wherein the sacrificial layer comprises a first material. A second material is placed over the sacrificial layer, wherein the second material comprises a material that is suitable for use as a second electrode. The sacrificial layer is removed with an etchant, wherein the etchant chemically reacts with the first material, and further wherein a region between the first electrode and the second electrode comprises a gap that is a distance of 50 nanometers or less, preferably 5 nanometers or less. Alternatively, the sacrificial layer is removed by cooling the sandwich with liquid nitrogen, or alternatively still, the sacrificial layer is removed by heating the sacrificial layer, thereby evaporating the sacrificial layer.

In U.S. Pat. No. 6,774,003 a method for manufacturing a pair of electrodes comprises fabricating a first electrode with a substantially flat surface and placing a sacrificial layer over a surface of the first electrode, wherein the sacrificial layer comprises a first material. A second material is placed over the sacrificial layer, wherein the second material comprises a material that is suitable for use as a second electrode. The sacrificial layer is removed with an etchant, wherein the etchant chemically reacts with the first material, and further wherein a region between the first electrode and the second electrode comprises a gap that is a distance of 50 nanometers or less, preferably 5 nanometers or less. Alternatively, the sacrificial layer is removed by cooling the sandwich with liquid nitrogen, or alternatively still, the sacrificial layer is removed by heating the sacrificial layer, thereby evaporating the sacrificial layer.

In U.S. Patent App. No. 2003/0068431 materials bonded together are separated using electrical current, thermal stresses, mechanical force, any combination of the above methods, or any other application or removal of energy until the bonds disappear and the materials are separated. In one embodiment the original bonding was composed of two layers of material. In another embodiment, the sandwich was composed of three layers. In a further embodiment, the parts of the sandwich are firmly maintained in their respective positions during the application of current so as to be able to subsequently align the materials relative to one another.

In WO03090245 a Gap Diode is disclosed in which a tubular actuating element serves as both a housing for a pair of electrodes and as a means for controlling the separation between the electrode pair. In a preferred embodiment, the tubular actuating element is a quartz piezo-electric tube. In accordance with another embodiment of the present invention, a Gap Diode is disclosed which is fabricated by micromachining techniques in which the separation of the electrodes is controlled by piezo-electric, electrostrictive or magnetostrictive actuators. Preferred embodiments of Gap Diodes include Cool Chips, Power Chips, and photoelectric converters.

In U.S. Pat. No. 3,169,200, a multilayer converter is described which comprises two electrodes, intermediate elements and oxide spacers disposed between each adjacent element. A thermal gradient is maintained across the device and opposite faces on each of the elements serve as emitter and collector. Electrons tunnel through each oxide barrier to a cooler collector, thereby generating a current flow through a load connected to the two electrodes. One drawback is that the device must contain some 106 elements in order to provide reasonable efficiency, and this is difficult to manufacture. A further drawback results from the losses due to thermal conduction: although the oxide spacers have a small contact coefficient with the emitter and collector elements, which minimizes thermal conduction, the number of elements required for the operation of the device means that thermal conduction is not insignificant.

In U.S. Pat. No. 6,876,123 a thermotunneling converter is disclosed comprising a pair of electrodes having inner surfaces substantially facing one another, and a spacer or plurality of spacers positioned between the two electrodes, having a height substantially equal to the distance between the electrodes, and having a total cross-sectional area that is less than the cross-sectional area of either of the electrodes. In a preferred embodiment, a vacuum is introduced, and in a particularly preferred embodiment, gold that has been exposed to cesium vapor is used as one or both of the electrodes. In a further embodiment, the spacer is made of small particles disposed between the electrodes. In a yet further embodiment, a sandwich is made containing the electrodes with an unoxidized spacer. The sandwich is separated and the spacer is oxidized, which makes it grow to a required height whilst giving it insulatory properties, to allow for tunneling between the electrodes.

There is a need in the art for devices having the simplicity of a layered structure to provide electrode separation without the use of active elements, in which problems of thermal conduction between the layers is reduced or eliminated.

BRIEF SUMMARY OF THE INVENTION

The present invention is directed towards a thermionic or thermotunneling gap diode device comprising electrodes having surfaces substantially facing one another, and which are separated by spacers disposed between the electrodes so that there is a gap between the electrodes; the surface area of the spacers in contact with the electrodes is less than the surface area of the electrodes not in contact with the spacers. In a further aspect, the present invention is directed toward an electrode for use in such a device that comprises an electrode surface having protrusions.

In a further aspect, the invention is directed toward a method for making a gap diode device comprising the steps of: oxidizing the surface of a substrate material; protecting selected areas of the oxidized layer in such a way that the protected areas are much less than the unprotected areas; removing areas of said oxidized layer which have not been protected, so that the protected areas remain as protrusions; and contacting an electrode so formed to another electrode, whereby the electrodes are positioned substantially facing each other, at a distance determined by the height of the protrusions.

In a further aspect, the process is extended to produce multiple thermionic or thermotunneling gap diodes, and in this embodiment the substrate material is a silicon sheet carrying multiple electrode regions, which is oxidized and protected as above prior to removing areas of the oxidized layer which have not been protected, so that the protected areas remain as protrusions; contacting the silicon sheet to another silicon sheet to form a composite wafer, whereby the electrodes are positioned substantially facing each other, at a distance determined by the height of the protrusions; and dicing the composite wafer to the size of the electrodes, to obtain individual thermionic or thermotunneling gap diode devices.

In a further aspect the process is extended to build individual integrated circuits with integrated active cooling devices in which the step of contacting the electrode formed as described above with another electrode comprises connecting the electrode with protrusions to a sheet of integrated circuits and dicing the composite wafer to form individual integrated circuits with integrated active cooling.

The approaches disclosed above utilize widely-applied silicon on insulator wafer bonding techniques to bond two silicon wafers with thin oxide layers in between. By not bonding the entire surface, for instance by trapping a small particle between two silicon wafers, due to the mechanical properties of silicon, a non-bonded area (void) of 5000 times the size (height) of the particle is created. Consequently, if two particles are spaced less than 2×5000 times the size of the particles, an even larger void is created. Using this idea, it is possible to form small "spacers" that keep the wafers at the desired distance of 5-10 nm without causing electrical or thermal "shorts".

This invention provides the simplicity of a layered structure to provide electrode separation without the use of active elements, and therefore problems of thermal conduction between the layers is reduced or eliminated.

Furthermore, this method of creating gap diode devices is inexpensive as it does not require active elements such as piezoelectric actuators to build and maintain the gap.

Furthermore, this invention discloses methods for manufacturing thermotunneling converters on a large scale, thus reducing costs and increasing the scope of potential applications.

BRIEF DESCRIPTION OF THE SEVERAL VIEWS OF THE DRAWING

Embodiments of the invention will now be described with reference to appropriate figures, which are given by way of example only and are not intended to limit the present invention.

For a more complete explanation of the present invention and the technical advantages thereof, reference is now made to the following description and the accompanying drawings, in which:

FIG. 11 shows a sandwich comprising two silicon wafers with a layer of silicon oxide in between.

DETAILED DESCRIPTION OF THE INVENTION

Figure 1:
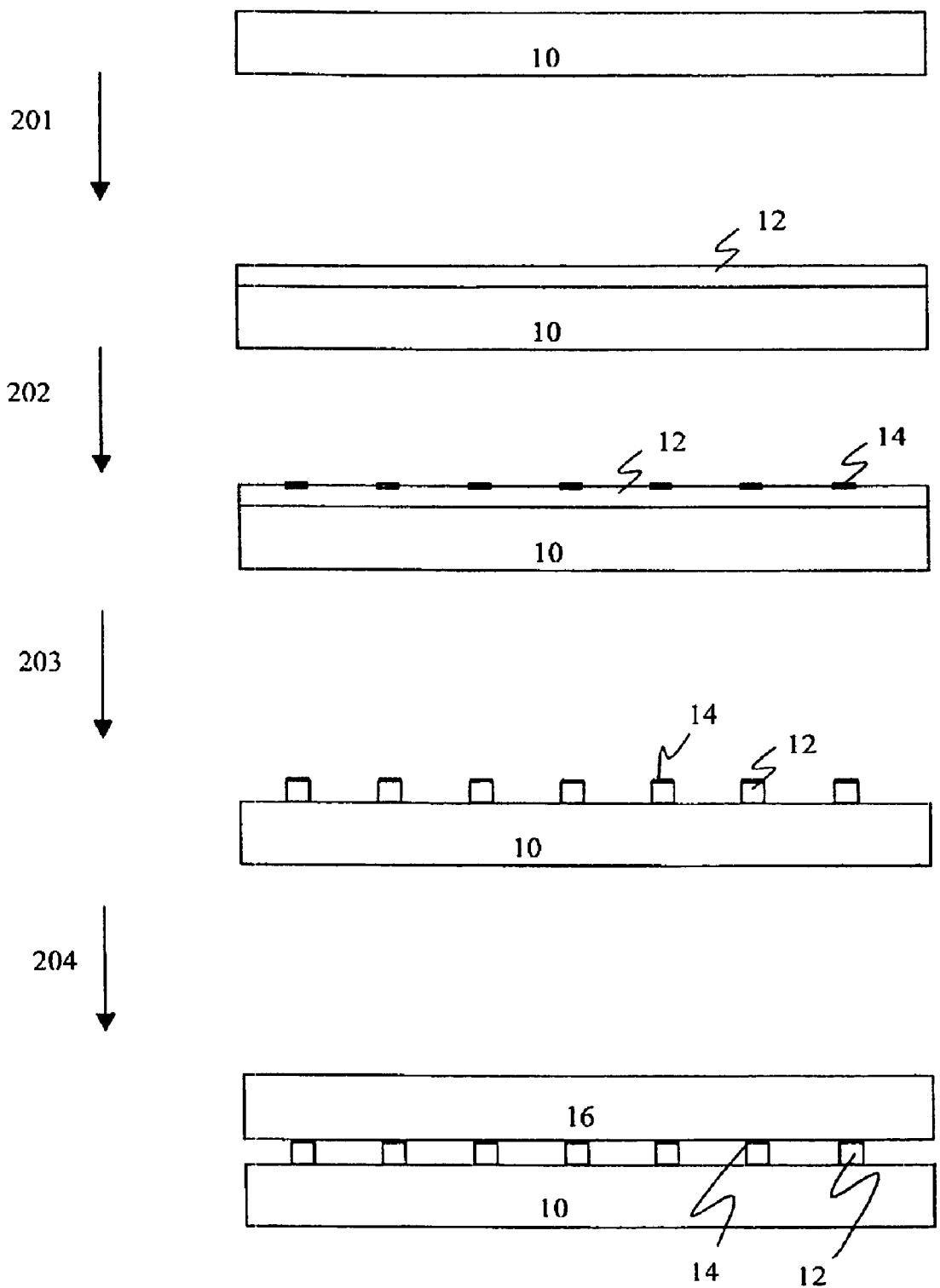
FIG. 1 is a diagrammatic representation of a process for building thermotunneling converters.

Referring now to FIG. 1, which shows a diagrammatic representation of a process for building thermotunneling gap diode devices, in a step 201, the surface of a silicon wafer 10 is oxidized to create a thin oxide film 12. Preferably, film 12 has a thickness of the order of 10 nm. In a step 202, an array of small dots 14 is created on the surface. This step may be accomplished for example and without limitation by standard photolithographic processes. In a step 203, the oxide material 12 between dots 14 is removed, for example, by an etching process. In a step 204, a second silicon wafer 16, of identical dimensions to wafer 10, is bonded to the top of a spacer array comprising dots 14 and oxide film 12 formed in step 203. Typically the distance between the spacers is between 10 and 10,000 times the height of the spacers.

The mechanical properties of silicon are such that if a small particle is trapped in between two silicon wafers, a non-bonded area (void) of 5000 times the size (height) of the particle is created. Therefore the spacers consisting of silicon oxide topped by a dot of protective layer will have the effect of keeping the two silicon wafers at a desired distance without the use of active elements.

This forms a structure in which the thermal flux across the assembly is reduced by the ratio of surface area of these spacers to the remaining surface area. A spacer of about 1 micrometer height leads to a gap with a diameter of approximately 5000 times that size, namely, 0.5 cm. These approximations are effective for typical 4 inch diameter silicon wafers, with a thickness of about 525 micrometers. It is understood that the invention is by no means limited to these measurements or approximations, and they are mentioned merely by way of example. A detailed example is given below.

Typically, the heat flux across such an assembly will be of the order of 5 W/cm$^2$ when the temperature across the assembly is 50K. In reality, the leakage will be even smaller, because the thermal conductivity of small dots is smaller than the published data for large quartz volumes. Furthermore, the spacers can be distributed even further out than the 2×5000× dot height (100A) used in this embodiment.

Preferably the second silicon wafer supports a number of circuits to be cooled, such as a microprocessor, graphics processor, memory chip and the like.

In this design, active piezo control is not required to maintain the gap, making the cooling device very inexpensive.

For optimal performance it may be necessary to achieve a work function of 1 eV or less on the active wafer to increase cooling power by increasing tunneling and thermionic emission of electrons.

These layers on the active wafer can be introduced using approaches commonly used in the art. For example, an active layer can be introduced on to the electrode by vacuum deposition, using materials such as zinc, lead, cadmium, thallium, bismuth, polonium, tin, selenium, lithium, indium, sodium, potassium, gallium diamond-like carbon, cesium or a combination thereof. Another possible method is sputtering, using materials such as titanium and silver. In a further example, an active layer such as copper is grown electrochemically onto the silicon layer. In another example, an electrically conducting paste, preferably silver, may be applied onto the electrode, or a thin film may be introduced using MEMS techniques. It is to be understood that the invention is in no way limited to these specific methods and they are mentioned only by way of example. Accordingly, any other suitable method may be used.

To increase the tunneling current, an electrostatic field has to be applied across the Gap by applying a Voltage potential to each wafer. Based upon the electric breakdown properties of $SiO_2$, a 5 Volt potential could be applied between the two wafers for an electric field of 5 MeV, well below the 8-11 MeV limit for quartz. According to published data, under these conditions the device has a cooling capacity of >>100 $W/cm^2$, making it extremely suitable for next generation IC's.

This method of building thermotunneling converters has many advantages over prior art methods, a principle advantage being that it is cheap to construct and maintain. Accordingly, many applications are possible.

One primary application relates to the construction of thermotunneling converters using a sheet of ICs as one of the electrodes. ICs are usually manufactured in bulk on a large wafer sheet. At the end of the IC manufacturing process, the majority of the substrate is removed by grinding the backside to achieve a thickness of 100-200 μm to improve the heat transfer from the active device surface to a heat sink. This embodiment uses ICs at this stage of the manufacturing process, as described below.

Figure 2:
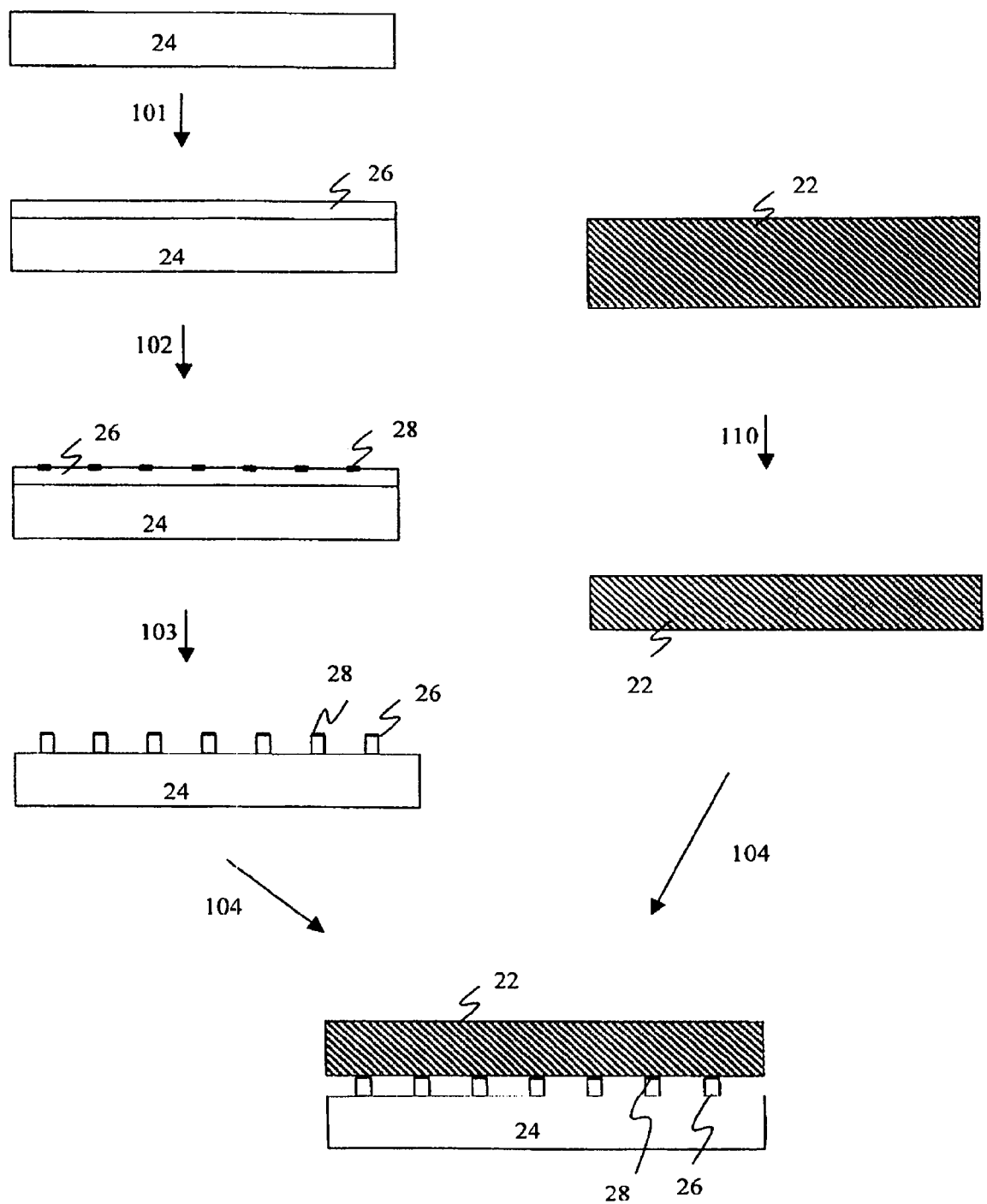
FIG. 2 is a diagrammatic representation of a process for building thermotunneling converters using a sheet of ICs as one of the electrodes.

FIG. 2 shows a diagrammatic representation of a process of building thermotunneling converters using an IC sheet as one of the electrodes. Referring now to FIG. 2, in a step 101, the surface of a large silicon wafer 24 is oxidized to create a thin oxide film 26, preferably with a thickness of 10 nanometers. In a step 102, an array of dots 28 are formed on oxidized surface 26, using photolithographic or other methods. In a step 103, the oxide in between dots 28 is removed by etching or other methods, to produce spacers.

In a step 110, IC silicon sheet 22, which can be any semiconductor material, of the same dimensions as sheet 24 is polished to achieve a thickness of 100-200 μm. In a step 104, sheet 24 with protruding spacers is then bonded to polished IC sheet 22. This creates a sheet of thermotunneling converters using the IC sheet as one of the electrodes.

Figure 3:
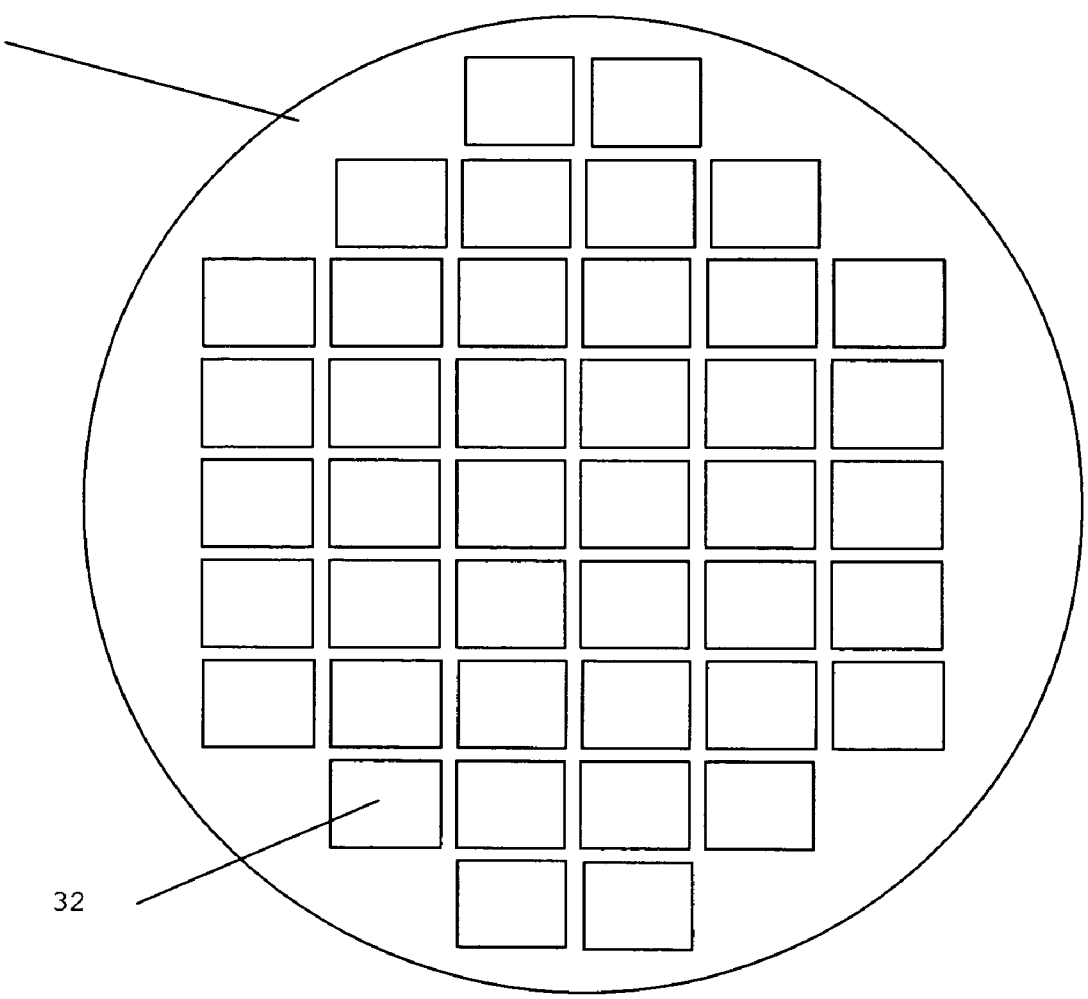
FIG. 3 shows a plurality of thermotunneling converters created on a single wafer.

Referring now to FIG. 3, shown is a wafer 30 with a plurality of thermotunneling converters 32 formed on the surface. In the embodiment described in FIG. 2, wafer 30 would be covered with an IC sheet of identical dimensions to wafer 30. Thermotunneling converters 32 would then be diced or laser cut to size, creating a plurality of individual ICs with in-built cooling devices.

Using this method, the building process can be performed very economically on the entire wafer scale, yielding hundreds of systems from a 300 mm diameter wafer.

For purposes of illustration, below is a detailed example of the specifications of a thermotunneling converter built using the methods described above.

EXAMPLE

Figure 4:
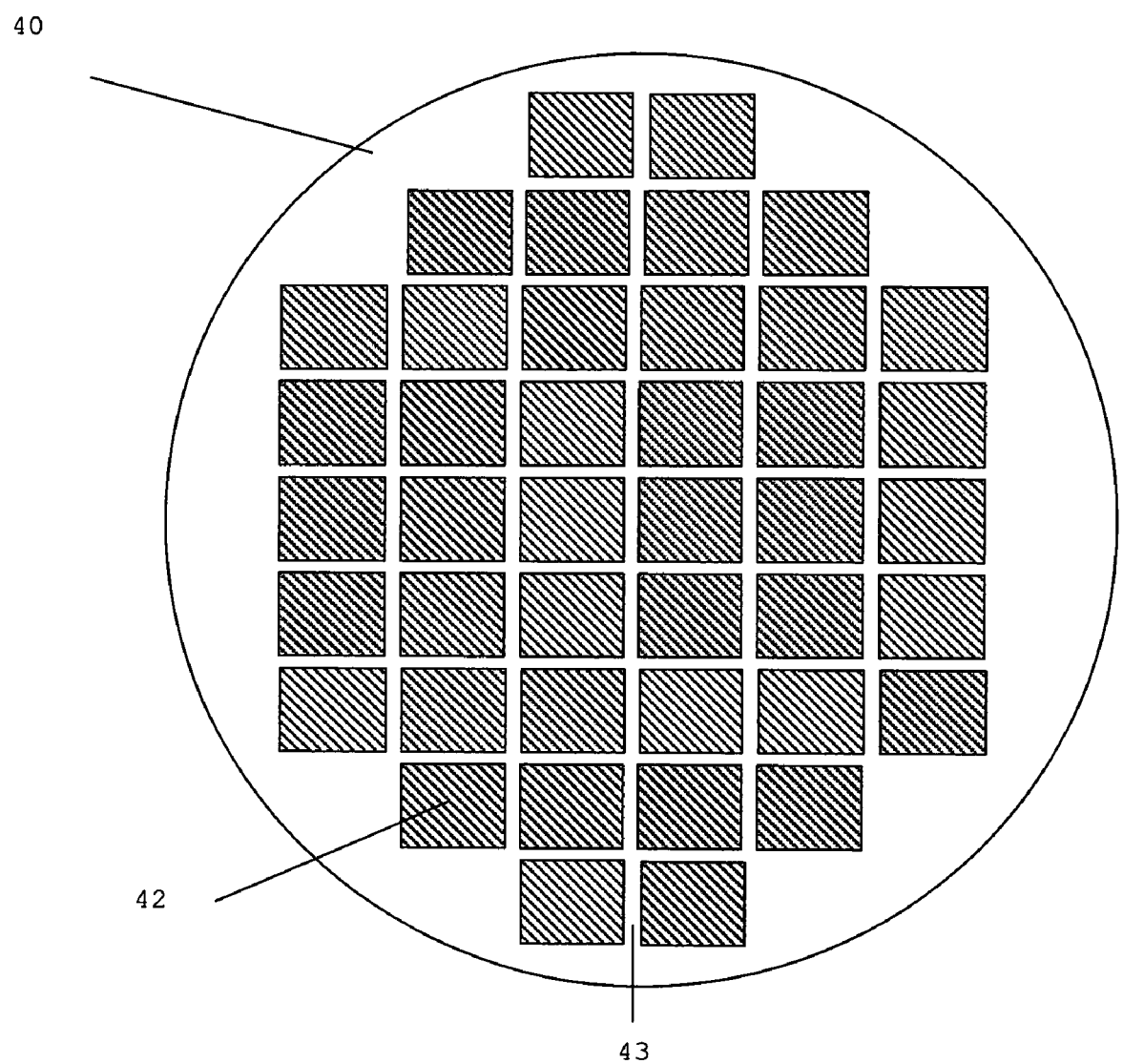
FIG. 4 shows a wafer on which a plurality of electrodes has been arranged, further showing the spaces in between the electrodes.
Figure 5:
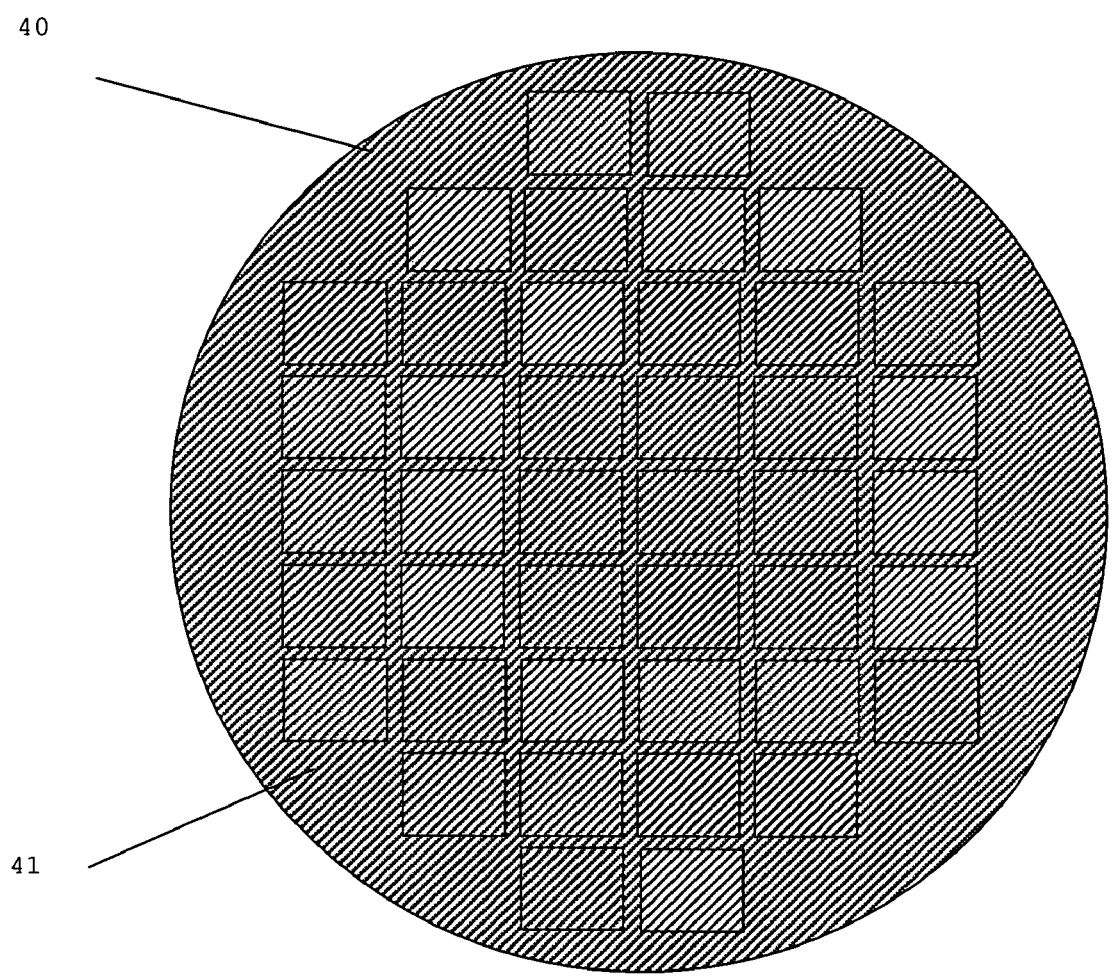
FIG. 5 shows the wafer of FIG. 4, further comprising an oxide layer.
Figure 6:
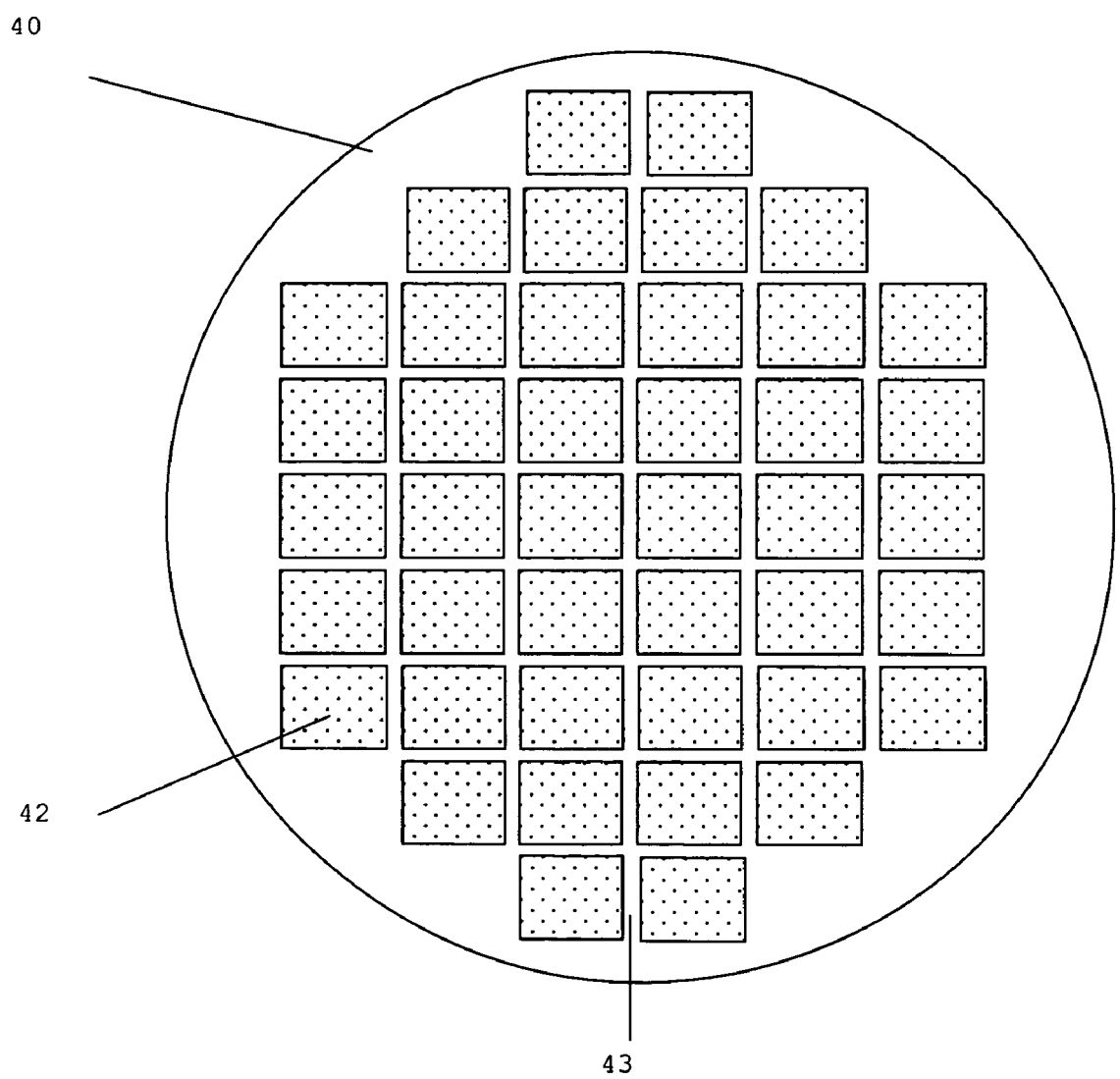
FIG. 6 shows the wafer of FIG. 5, after dots have been formed on the wafer and the remaining oxide removed.

Referring now to FIG. 4, shown is a circular silicon wafer 40 of 200 mm diameter. Arranged on the surface of wafer 40 are a plurality of rectangular electrodes 42, 25×20 mm2 in size. Rectangular electrodes 42 fill as much surface space of wafer 40 as is possible, while leaving an aisle 43 of 2 mm between each device. Referring now to FIG. 5, wafer 40 is oxidized to create an oxide layer 41 on the entire surface of wafer 40. FIG. 6 shows wafer 40 after dots have been formed on rectangles 42 and the oxide in between the dots removed. Oxide is also removed from aisles 43 in between rectangles 42.

It is understood that a second wafer of identical dimensions to wafer 40 is attached to wafer 40 in order to create a sheet of thermotunneling converters, which can then be cut into individual converters.

Figure 7:
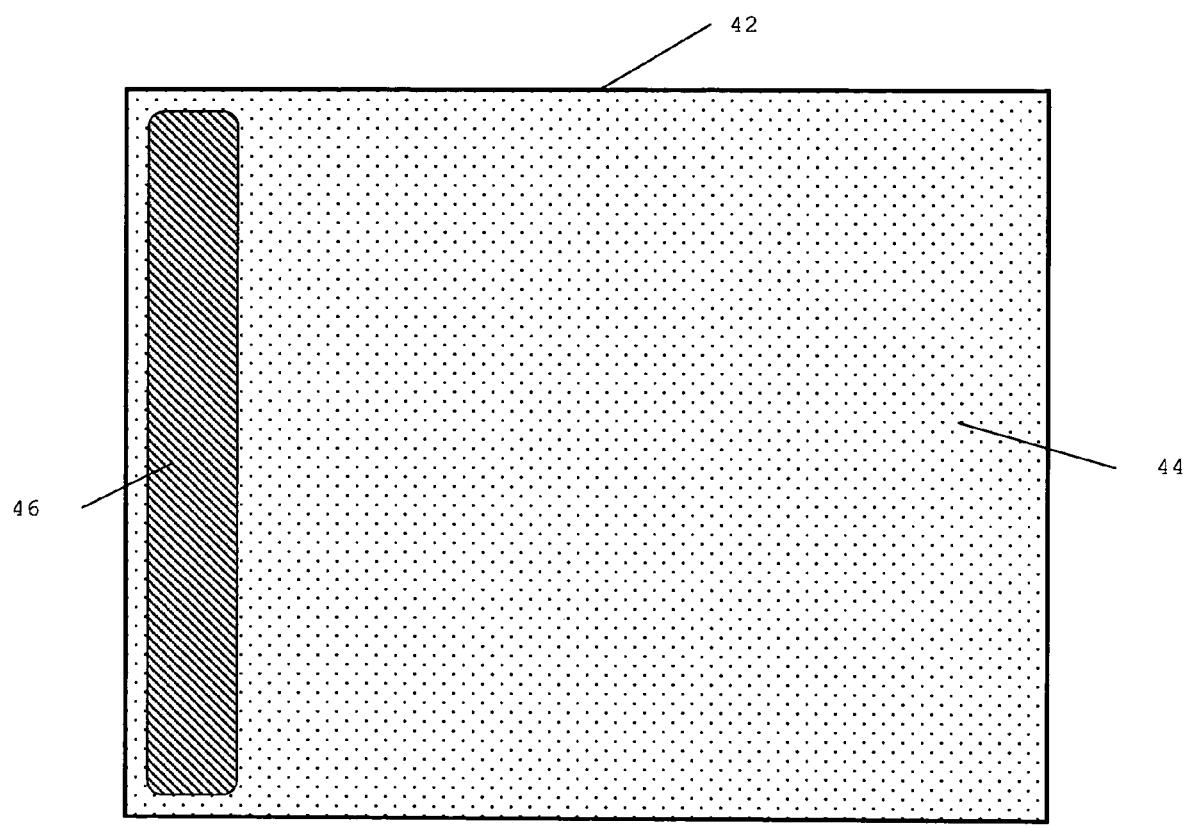
FIG. 7 shows one electrode of a thermotunneling converter comprising spacer dots and a bond pad.

FIG. 7 shows one rectangular electrode 42 of wafer 40. Rectangular electrode 42 comprises a silicon wafer covered with a layer of oxidized silicon. A bond pad 46 of 5×20 mm is positioned at one side of electrode 42 to hold the two electrodes in place. A plurality of dots 44 with a diameter of 350 nanometers and 15 nanometers in height is arranged on rectangular electrode 42 at a distance of 100 micrometers. The oxide in between dots 44 is removed to give an array of spacers consisting of silicon oxide topped by a dot of protective layer, as described above.

Figure 8:
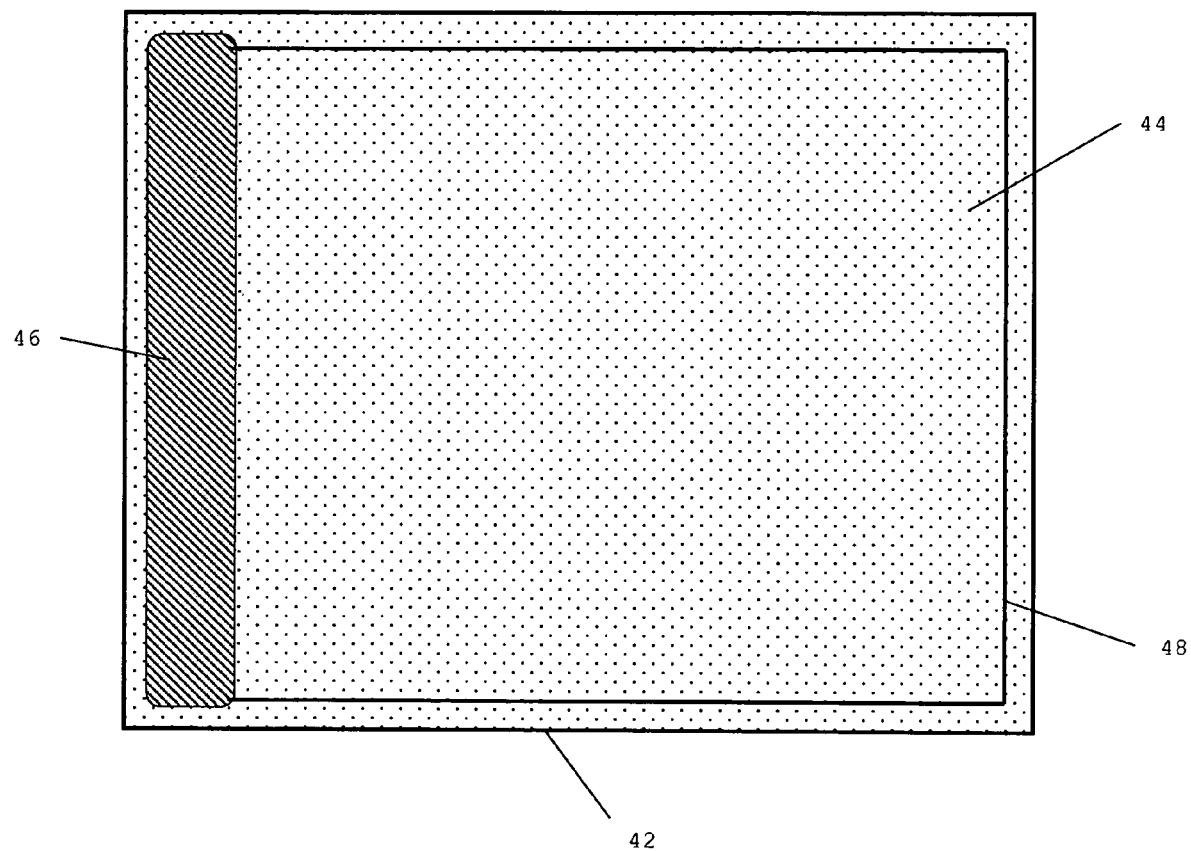
FIG. 8 shows the electrode of FIG. 7 further comprising an oxide seal.

Referring now to FIG. 8, shown is one embodiment of electrode 42 with the addition of an oxide seal 48 positioned around the perimeter of electrode 42 to maintain the vacuum inside seal 48.

Figure 9:
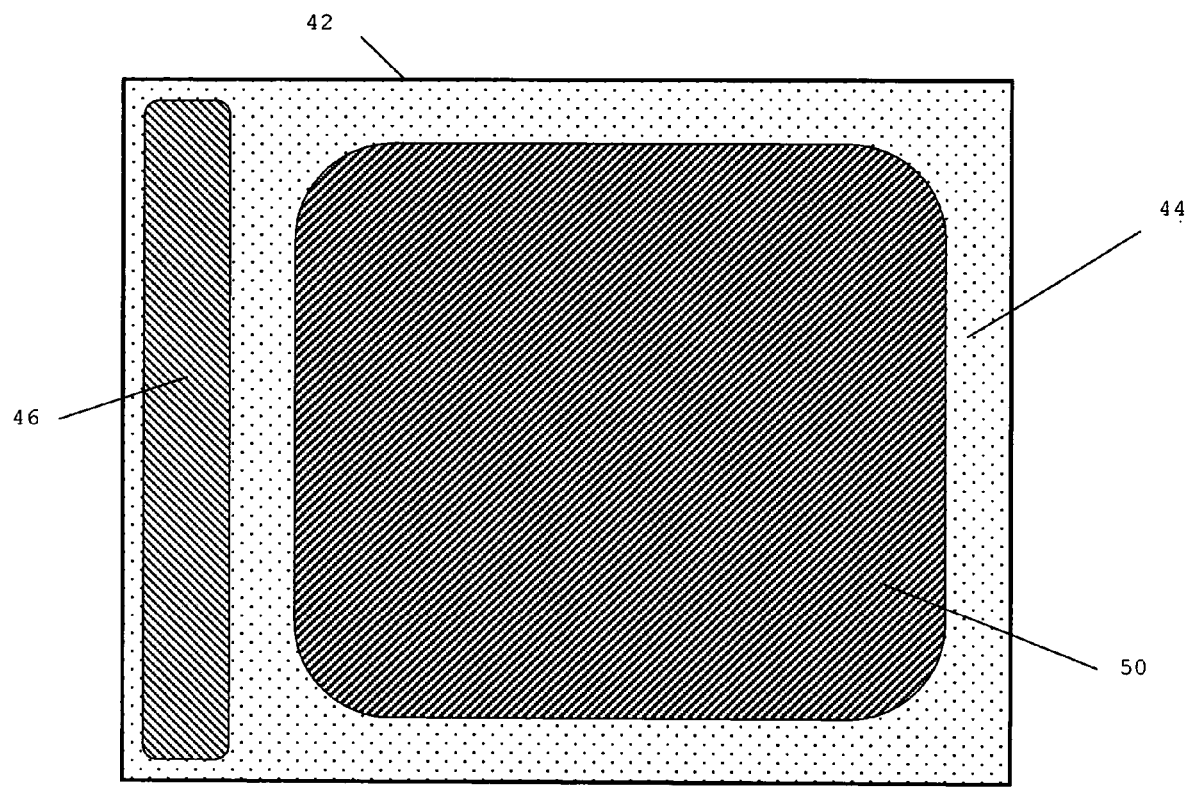
FIG. 9 shows the electrode of FIG. 7, further showing the point at which the electrode is joined to a device that is to be cooled.

Referring now to FIG. 9, a rectangular area 50 on electrode 42 is in thermal contact with a device that is to be cooled. Area 50 measures approximately 14×14 mm and is positioned in the center of the area remaining after the bond pad has been positioned at one side of electrode 42.

Figure 10:
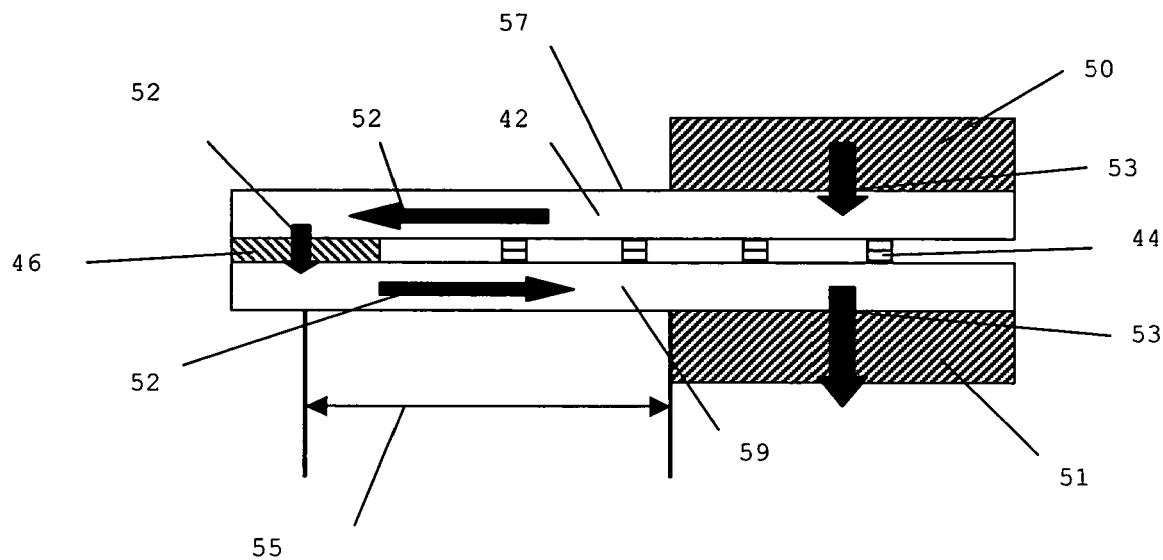
FIG. 10 shows a thermotunneling converter comprising two electrodes with spacers in between, showing the direction of heat flow through the converter.

FIG. 10 shows electrode 42 attached to a second electrode 59, of identical dimensions as electrode 42, thereby forming a thermotunneling converter 57. Area 50 on first electrode 42 represents the device to be cooled, whereas area 51 on second wafer 59 is in thermal contact with a heat sink. Arrows 53 indicate the direction in which heat flows through thermotunneling converter 57.

Because area 50 is not in close proximity to bond pad 46, there will be very little thermal leakage through bond pad 46. Arrows 52 indicate the path along which the heat will travel. Considering that the length of the edge zone 46 is 4*20 mm, the active wafer is thinned down to about 100 μm, and the distance between bonded edge zone 46 and the active area 50 is 5 mm, as indicated by arrow 55, the thermal leakage through edge zone 46 will be about 5 Watt. This is illustrated in Table A:

---
Heat flux through wafer and bonded area
Path in wafer 5 mm × 0.100 mm × 80 mm
∂T = 25 C. Therm. conductivity Silicon 125 W/m × K
W = 5 W

---

Table B illustrates the specifications of thermotunneling converter 57, and the resulting heat flux that will be obtained.

TABLE B

| | | | | |
|---|---|---|---|---|
| Area of spacer dots | diameter: L [nm] | 350 | 9.62E−14 M$^2$ | |
| Height of spacer | H [nm] | 15 | 1.50E−08 M | |
| Distance between spacer | Multiplier | 3333 | 1.00E−04 M | $D_{max} = 2 \times 5000 \times h$ |
| Area between spacers | | | 1.00E−08 M$^2$ | |
| Ratio spacer/unbonded Areas | | | 9.62E−06 | |
| Thermal conductivity SiO$_2$ | Max, thick films | | 1.1 W/m/K | |
| Length of conductor | H [nm] | 15 | 1.50E−08 m | |
| Heat Flux through SiO$_2$ at ∂T [K] | | 50 | 3.53E+05 W/cm$^2$ | |
| Heat Flux through spacers | | | 3.4 W/cm$^2$ | (at D = 150 μm) |
| Electric Field at applied Voltage [V] | | 5 | 3.3 Mv/cm | |

As is illustrated by Table B, using the above configurations, the heat flux through the spacers will be reduced to only 3.4 W/cm$^2$. This is a significant reduction and will allow for the converters to achieve efficient cooling.

Figure 11:
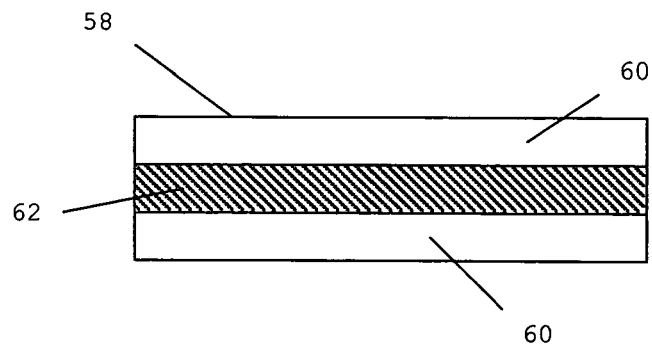

Referring now to FIG. 11, shown is a sandwich 58 comprised of two silicon wafers 60, of the same dimensions as electrodes 42 and 59, with a layer of oxidized silicon 62 positioned in between them. Oxidized silicon layer 62 has the same height of 15 nanometers as do spacer dots 44. Thus, in effect, sandwich 58 shows a device of the above method with the exclusion of the stages of forming protective dots on the oxide layer and removing the remaining oxide. Using the configurations described in Table B above, the heat flux through sandwich 58 would be 353,333 W. It is thus clearly illustrated that the spacer dots provide an advantage of considerable magnitude.

There are many other possible embodiments to this invention. For example, one embodiment involves oxidizing both electrodes of a converter, creating spacers protruding from both sides. In one embodiment the spacers are formed in exactly the same place on both electrodes, so when the electrodes are bonded the spacers meet and create a gap of double the height.

In another embodiment, the spacers are formed on each electrode at double the distance needed in the above mentioned method. However, they are positioned in different places on each electrode so that when the two electrodes are bonded to form a converter, the resulting gaps between the spacers are of the size necessary for the converter to function efficiently.

In another embodiment, a multitude of CoolChips is formed from two wafers that are prepared according to this invention. The composite wafer is then diced and the individual CoolChip dies are then bonded to individual IC dies.

In another embodiment, a coolchip die is mounted into a conventional heatsink which is then mounted to a conventional IC chip package, providing cooling below ambient temperature to the IC.

In other embodiments, alternative methods are used to create a layer on an electrode surface.

In another embodiment, the width of the bonding pad is reduced to the same width as the oxide seal to further reduce the parasitic heat flux through the bond pad.

In another embodiment, bonding is performed in a vacuum chamber to reduce the parasitic heat flux through otherwise trapped gas between the electrodes.

In another embodiment, bonding is performed in a controlled atmosphere of a gas that reacts with the electrode material during the bonding anneal and forms a protective layer on either or both electrodes and creates a vacuum between the electrodes. It is to be understood that the invention is not limited to any of the above mentioned specifications:

The present invention is thus directed to a method for building thermotunneling gap diode devices. One particular application of this method, as disclosed above, relates to building thermotunneling converters on a large scale for the purpose of cooling ICs.

The invention claimed is:

1. A thermionic or thermotunneling gap diode device comprising:
    a) a pair of electrodes having surfaces substantially facing one another;
    b) spacers comprising silicon oxide topped by a dot of protective layer, wherein said protective layer is present only as a part of said spacers and not elsewhere on said surfaces of said electrodes and wherein said spacers are disposed between said surfaces to allow a gap between said electrodes;
    wherein said spacers are in direct contact with said electrodes, wherein said gap is of the order of 10-15 nm, and wherein a surface area of said spacers in contact with said surfaces is less than a surface area of said surfaces.

2. The gap diode device of claim 1 wherein one or both of said electrodes comprise silicon.

3. The gap diode device of claim 1 wherein a distance between said spacers is in the range of 10 to 10,000 times a height of said spacers.

4. An electrode for use in the gap diode device of claim 1 comprising:
    a) an electrode surface, wherein said electrode comprises silicon;
    b) spacers protruding from said electrode surface having a height of the order of 10-15 nm said spacers comprising silicon oxide topped by a dot of protective layer.

5. The electrode of claim 4 wherein an exposed area between said spacers comprises silicon from which oxidized silicon has been removed.

6. The electrode of claim 4 wherein a distance between said spacers is in the range of 10 to 10,000 times a height of said spacers.

7. The gap diode device of claim 1 wherein one of said electrodes supports one or more circuits to be cooled.

8. The gap diode device of claim 7 wherein said circuits are selected from the group consisting of: a microprocessor, a graphics processor, and a memory chip.

9. The gap diode device of claim 1 wherein one of said electrodes additionally comprises an active layer.

10. The gap diode device of claim 9 wherein said active layer is selected from the group consisting of: zinc, lead, cadmium, thallium, bismuth, polonium, tin, selenium, lithium, indium, sodium, potassium, gallium diamond-like carbon, cesium, titanium and silver.

11. The gap diode device of claim 1 wherein one of said electrodes has a thickness in the range of 100-200 μm.

12. The electrode of claim 4 additionally comprising a bond pad positioned at one side of said electrode.

13. The electrode of claim 4 additionally comprising an oxide seal positioned around a perimeter of said electrode.

14. A thermionic or thermotunneling device comprising:
 a) a first wafer;
 b) a second wafer; and
 c) a plurality of gap diode devices wherein each of said plurality of gap diode devices is a gap diode device of claim 1;
 wherein one of said pair of electrodes is disposed on said first wafer and the other of said pair of electrodes is disposed on said second wafer.

15. The device of claim 14 wherein one of said wafers has a thickness in the range of 100-200 μm.

16. The device of claim 14 wherein each one of said pair of electrodes disposed on a first wafer additionally comprises a bond pad positioned at one side of each one of said pair of electrodes.

17. The device of claim 14 wherein each one of said pair of electrodes disposed on a first wafer additionally comprising an oxide seal positioned around a perimeter of each one of said pair of electrodes.

18. The gap diode device of claim 1 wherein said dot of protective layer separates said silicon oxide from one of said surfaces.

* * * * *